(12) United States Patent
Bar et al.

(10) Patent No.: US 8,704,358 B2
(45) Date of Patent: Apr. 22, 2014

(54) METHOD FOR FORMING AN INTEGRATED CIRCUIT

(71) Applicant: STMicroelectronics S.A., Montrouge (FR)

(72) Inventors: Pierre Bar, Grenoble (FR); Sylvain Joblot, Bizonnes (FR); Nicolas Hotellier, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 13/688,008

(22) Filed: Nov. 28, 2012

(65) Prior Publication Data

US 2013/0140693 A1    Jun. 6, 2013

(30) Foreign Application Priority Data

Dec. 2, 2011   (FR) ...................... 11 61066

(51) Int. Cl.
*H01L 23/04* (2006.01)
(52) U.S. Cl.
USPC ............... 257/698; 257/773; 257/E23.011; 257/E21.597; 438/459; 438/667
(58) Field of Classification Search
USPC ............. 257/698, 773, E23.011, E21.597; 438/459, 667
See application file for complete search history.

(56) References Cited

U.S. PATENT DOCUMENTS

| 8,581,414 | B2 * | 11/2013 | Fujita | ............................ 257/774 |
| 2004/0212086 | A1 | 10/2004 | Dotta et al. | |
| 2007/0037379 | A1 | 2/2007 | Enquist et al. | |
| 2007/0166997 | A1 | 7/2007 | Knorr | |
| 2010/0144094 | A1 * | 6/2010 | Chen et al. | .................... 438/109 |
| 2012/0061794 | A1 * | 3/2012 | Sadaka | ......................... 257/503 |
| 2012/0280395 | A1 * | 11/2012 | Farooq et al. | ................ 257/754 |
| 2013/0187289 | A1 * | 7/2013 | Cobbley et al. | ............... 257/774 |

FOREIGN PATENT DOCUMENTS

EP    1675171 A2    6/2006

OTHER PUBLICATIONS

French Search Report and Written Opinion dated Jul. 30, 2012 from corresponding French Application No. 11/61066.

* cited by examiner

*Primary Examiner* — Trung Q Dang
(74) *Attorney, Agent, or Firm* — Wolf, Greenfield & Sacks, P.C.

(57) ABSTRACT

A method for forming an integrated circuit including the steps of: a) forming openings in a front surface of a first semiconductor wafer, the depth of the openings being smaller than 10 μm, and filling them with a conductive material; b) forming doped areas of components in active areas of the front surface, forming interconnection levels on the front surface and leveling the surface supporting the interconnection levels; c) covering with an insulating layer a front surface of a second semiconductor wafer, and leveling the surface coated with an insulator; d) applying the front surface of the second wafer coated with insulator on the front surface of the first wafer supporting interconnection levels, to obtain a bonding between the two wafers; e) forming vias from the rear surface of the second wafer, to reach the interconnection levels of the first wafer; and f) thinning the first wafer to reach the openings filled with conductive material.

13 Claims, 4 Drawing Sheets

METHOD FOR FORMING AN INTEGRATED CIRCUIT

CROSS REFERENCE TO RELATED APPLICATIONS

This application claims the priority benefit of French patent application number 11/61066, filed on Dec. 2, 2011, entitled "Method of Forming an Integrated Circuit," which is hereby incorporated by reference to the maximum extent allowable by law.

BACKGROUND

1. Technical Field

The present disclosure relates to a method for forming an integrated circuit chip, and more specifically a method for forming an integrated circuit chip having its front surface and its rear surface electrically connected by means of a via crossing the wafer.

2. Discussion of the Related Art

To improve the compactness and the performance of integrated circuits, it is desired to transfer connections to components manufactured on the front surface of a semiconductor wafer (or semiconductor substrate) to the rear surface of the wafer. To achieve this, vias forming the wafer, currently designated in the art as TSVs ("Through Substrate Vias"), should be formed. Such vias comprise one or several materials which are good electric and/or heat conductors.

To limit the thickness of the substrate to be crossed, the forming of integrated circuits comprising TSV-type vias generally results in the manipulation of semiconductor wafers of very small thickness. This generates a high mechanical stress in the wafer and in the integrated circuit. Further, to limit the loss of useful area on the side of the wafer where the components are formed, it is desired to form vias having as small a cross-section as possible. It is thus desired to form vias having a high form factor, the form factor of a via being defined as the ratio of the depth of the via to the width of this via.

Generally, presently-used technologies enable to easily manufacture vias having a form factor ranging between 1 and 10. For a thin wafer, having a thickness on the order of 80 µm, the smallest via width that can be easily manufactured thus is approximately 8 µm. For technologies where the dimensions of elementary active components are smaller than one micrometer, or even than one tenth of a micrometer, such widths are very large as compared with the dimensions of the manufactured components, mainly transistors. A portion of the surface of the semiconductor wafer normally dedicated to component manufacturing is thus sacrificed for the manufacturing of through vias. Thus, the provision of vias may result in a decrease in the density of components per surface area unit.

To decrease the width of through vias, the wafer should thus be thinned as much as possible. Wafers of large diameter, for example, wafers having a 300-mm diameter, which generally have an initial thickness approximately ranging from 700 to 800 µm, become brittle and difficult to manipulate after a thinning. The front surface of the wafer is thus glued to a temporary handle, that is, to another thicker wafer, after which the wafer is thinned. Openings are then formed from the new rear surface of the wafer, after which the walls and the bottom of the openings are covered with a layer of a conductive material. To obtain a conformal deposition of the conductive material on the walls and the bottom of the openings, high temperatures should be used. Presently, glues used for gluing of the wafer on the temporary handle do not stand well temperatures greater than approximately 250° C. A disadvantage of such methods is the fact that they may be limited to simplifying manufacture of vias having a limited form factor, generally ranging between 1 and 3.

According to another known method, to improve the form factor of the vias, the vias are formed before the temporary gluing of the wafer on a handle, and before thinning of the wafer. However, due to the desired final thickness of the wafer, generally on the order of 80 µm, a disadvantage of such a method is the expensive filling of the vias.

Another disadvantage of the above-described methods is that, once the handle has been removed, the wafer is brittle. The wafer is then difficult to manipulate in subsequent encapsulation steps. By such methods, it is thus difficult to obtain wafers having a thickness smaller than approximately 80 µm, and thus through vias having a width smaller than 8 µm.

There thus is a need for a method enabling to transfer connections to components manufactured on the front surface of a semiconductor wafer to the rear surface of the wafer by vias having the smallest width possible.

SUMMARY

Thus, an embodiment provides a method for forming an integrated circuit having a surface capable of being placed on another integrated circuit, on a printed circuit, or on a package, and having its other surface capable of receiving an additional integrated circuit, the method comprising the steps of: a) forming openings in a front surface of a first semiconductor wafer, the depth of the openings being smaller than 10 µm, and filling them with a conductive material; b) forming doped areas of components in active areas of the front surface, forming interconnection levels on said front surface and leveling said surface supporting the interconnection levels; c) covering with an insulating layer a front surface of a second semiconductor wafer, and leveling said surface coated with an insulator; d) applying the front surface of the second wafer coated with insulator on the front surface of the first wafer supporting interconnection levels, to obtain a bonding between the two wafers; e) forming vias from the rear surface of the second wafer, to reach the interconnection levels of the first wafer; and f) thinning the first wafer to reach the openings filled with conductive material.

According to an embodiment, at step d), the bonding between the first wafer and the second wafer is obtained by thermocompression bonding or by direct bonding.

According to an embodiment, the method further comprises, at step c), a step of forming of conductive contacts at the surface of the insulator layer covering the front surface of the second wafer.

According to an embodiment, at step d), each conductive contact comes into contact with a surface metallization of the interconnection levels of the first wafer and, at step e), the vias are formed to reach the conductive contacts.

According to an embodiment, the thickness of the first wafer after thinning is smaller than the depth of the openings and ranges between 3 and 10 µm.

According to an embodiment, step a) of forming and filling of the openings of the first wafer comprises the steps of: coating the walls of said openings with insulator; and filling said insulated openings with a conductive material.

According to an embodiment, the method further comprises the step of forming second openings at the same time as said openings, and of filling the second openings with an insulating material to fully insulate active areas of the front surface of the first wafer.

According to an embodiment, the second wafer has an initial thickness ranging between 650 and 750 μm and is thinned, after step d) of application of the front surfaces of each wafer against each other, down to a thickness ranging between 80 and 350 μm.

Another embodiment provides a method for forming an integrated circuit having a surface capable of being placed on another integrated circuit, on a printed circuit, or on a package, and having its other surface capable of receiving an additional integrated circuit, said integrated circuit resulting from the dicing into chips of an assembly comprising: a first semiconductor wafer having a substrate thickness smaller than 10 μm, having its front surface comprising doped areas of components in active areas and supporting interconnection levels, said first wafer comprising through insulated openings filled with a conductive material; a second semiconductor wafer, having its front surface supporting an insulator layer, placed by thermocompression bonding or by direct bonding against the front surface of the first wafer supporting the interconnection levels, and having its rear surface supporting a redistribution layer comprising contacting areas, said second wafer comprising a plurality of through vias; and copper pillars capable of receiving contacts of an additional integrated circuit, attached to the openings filled with conductive material on the side of the rear surface of the first wafer.

According to an embodiment, the substrate thickness of the first wafer ranges between 3 and 10 μm and is smaller than the depth of the openings, and the width of said openings is smaller than 1 μm.

According to an embodiment, the first wafer further comprises second through openings filled with an insulating material, capable of fully insulating active areas.

According to an embodiment, the substrate thickness of the second wafer ranges between 80 and 350 μm, and the width of the through vias ranges between 8 and 50 μm.

According to an embodiment, the material for filling said openings is selected from the group comprising polysilicon, tungsten, and copper, and the material for filling the second openings is silicon oxide.

The foregoing and other features and advantages will be discussed in detail in the following non-limiting description of specific embodiments in connection with the accompanying drawings.

BRIEF DESCRIPTION OF THE DRAWINGS

For clarity, the same elements have been designated with the same reference numerals in the different drawings and, further, as usual in the representation of integrated circuits, the various drawings are not to scale.

DETAILED DESCRIPTION

FIGS. 1A to 1K are cross-section views schematically illustrating successive steps of a method for forming an integrated circuit.

Figure 1A:
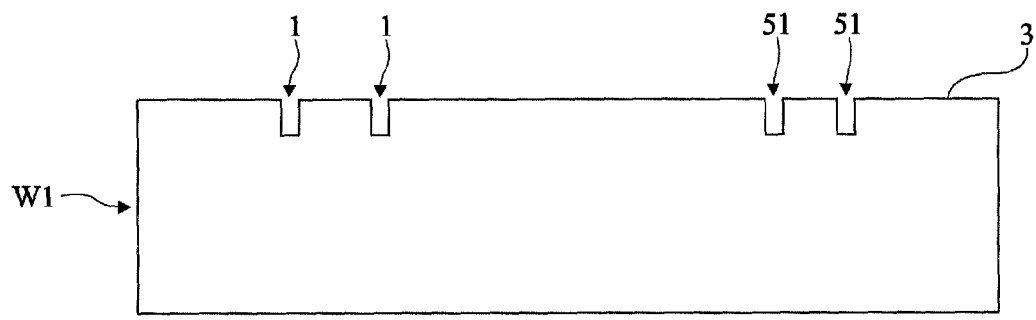
FIGS. 1A to 1K are cross-section views illustrating successive steps of a method for forming an integrated circuit.

FIG. 1A shows a semiconductor wafer W1, in which openings 1 have been formed from front surface 3. The depth of the openings is smaller than the wafer thickness. For example, the wafer thickness ranges between 650 and 750 μm, for example 700 μm, and the depth of the openings is smaller than 10 μm. The openings for example have a circular cross-section. The diameter (or the width) of openings 1 is for example smaller than 1 μm.

Figure 1B:
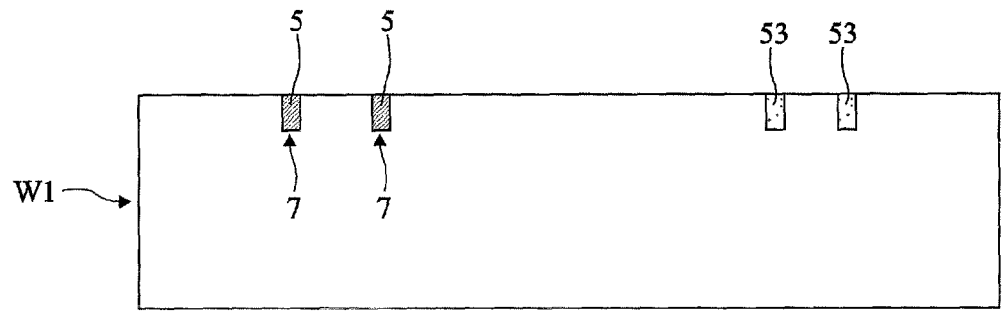

After the forming of openings 1, the walls of the openings are covered with an insulating material, after which, as illustrated in FIG. 1B, the openings are entirely filled with a conductive material 5, for example, polysilicon or tungsten. Vias 7 of very small width are thus obtained.

Figure 1C:
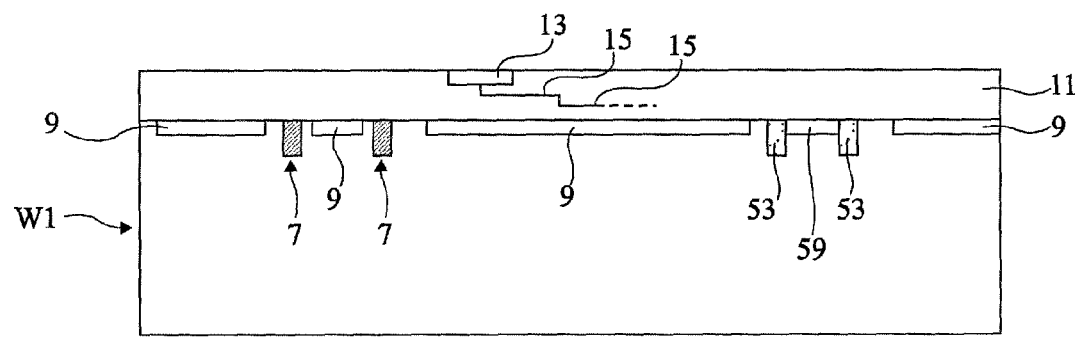

As illustrated in FIG. 1C, a next step comprises forming doped areas of components in active areas 9 close to the front surface of wafer W1, at the locations which are not taken up by vias 7. A determined distance, for example, on the order of 1 μm, will preferably be provided between the edge of a via 7 and the limit of a doped area.

According to a variation, it is possible to first form the doped areas of components and to then form openings 1. Conductive material 5 for filling the openings may then for example be polysilicon, tungsten, or copper.

Interconnection levels 11 are then formed on the front surface of wafer W1. A surface metallization 13 is shown as an example, as well as metallizations 15 of intermediary levels. The upper surface of interconnection levels 11 is thus leveled, for example, by chem.-mech. polishing.

Figure 1D:
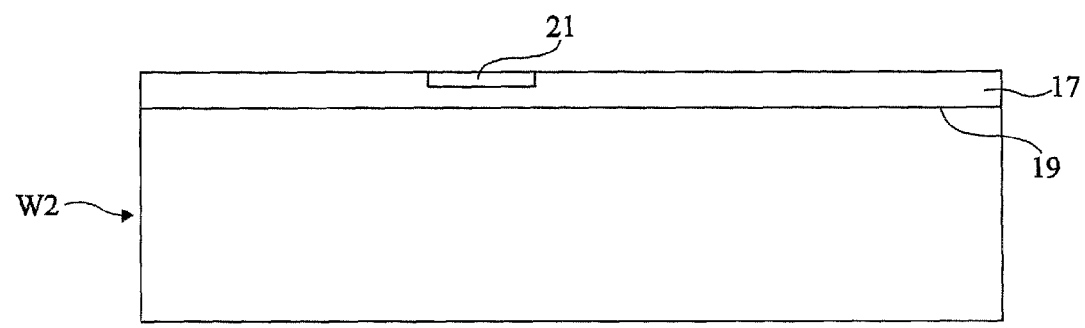

At the step illustrated in FIG. 1D, front surface 19 of another wafer W2, for example, of the same semiconductor, of same dimension as wafer W1, is covered with an insulator layer 17. At this step, conductive contacts 21, for example, made of copper, may be formed at the surface of insulating layer 17. The upper surface of insulating layer 17 is then leveled, for example, by chem.-mech. polishing.

Figure 1E:
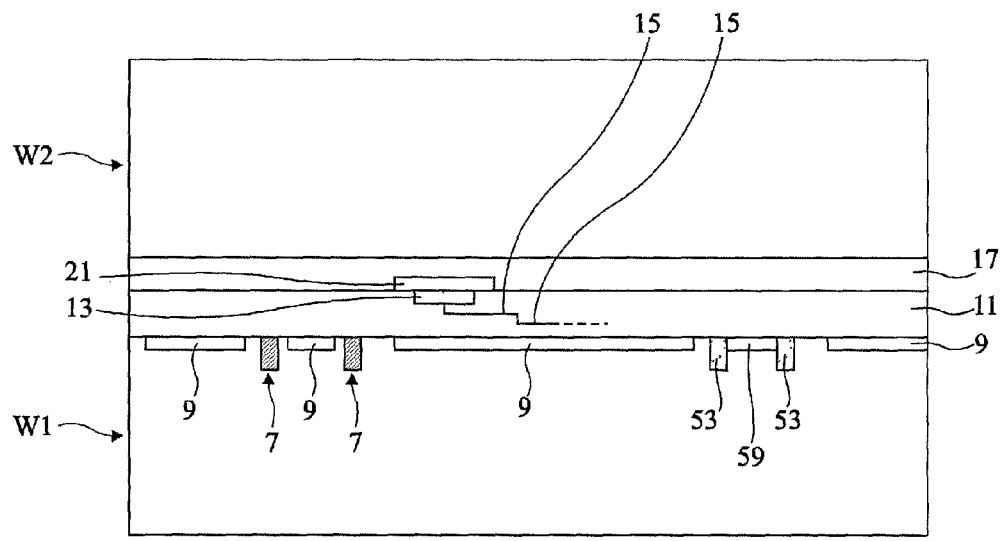

As illustrated in FIG. 1E, a next step comprises applying the front surface of wafer W2 coated with insulator layer 17 on the front surface of wafer W1 supporting interconnection levels 11. The surfaces of the two wafers which are applied against each other have been previously processed and leveled to perform a thermocompression bonding or a direct bonding between wafers W1 and W2. Further, each contact 21 which may have been formed at the surface of insulating layer 17 at the step illustrated in FIG. 1D comes into contact with a surface metallization 13 of wafer W1.

Figure 1F:
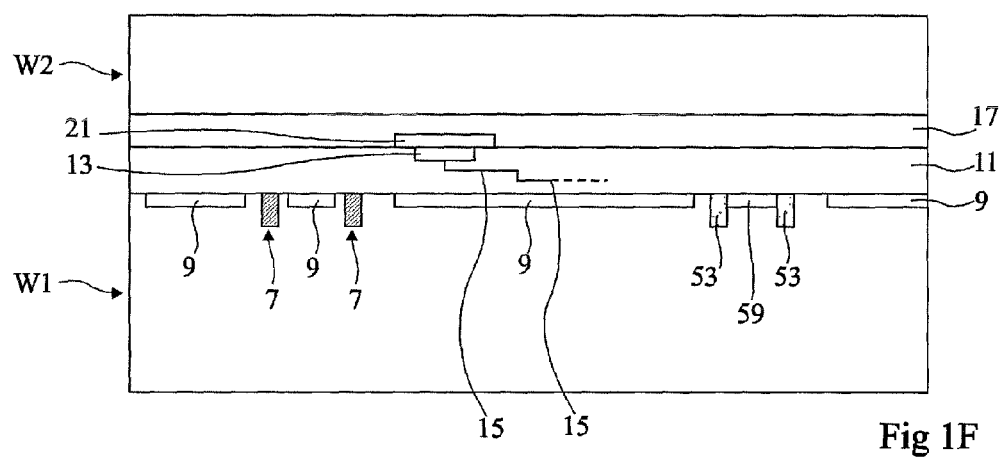

At the step illustrated in FIG. 1F, wafer W2 is thinned, so that the thickness of wafer W2 after thinning is, for example, between 80 and 350 μm, for example, on the order of 300 μm. Such thicknesses enable to ensure a sufficient mechanical integrity of wafer W2 without requiring the use of a temporary handle.

Figure 1G:
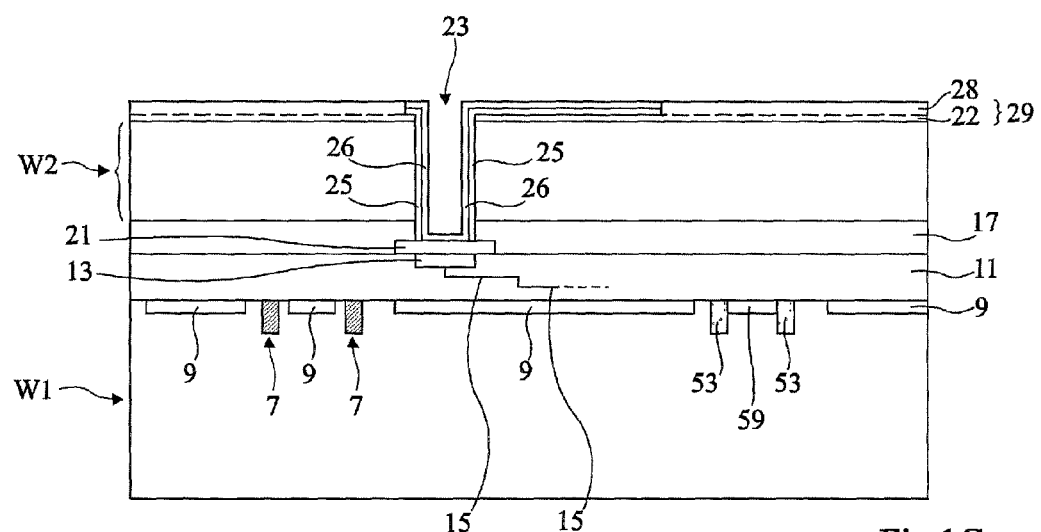

After having thinned wafer W2, as illustrated in FIG. 1G, openings 23 are formed, a single one being shown, from the new rear surface of wafer W2, to reach interconnection levels 11 of wafer W1. The bottom of openings 23 for example coincides with a contact 21 connected to a surface metallization 13, or directly with a surface metallization. Openings 23 have a diameter between 8 and 50 μm, for example, on the order of 35 μm. The walls of openings 23 of a layer 25 are then covered with an insulating material. A layer 26 of a conductive material which covers the walls and the bottom of the openings and comes into contact with conductor 21 or a surface metallization 13 is then deposited. According to an embodiment, layer 26 may be a bonding layer, for example, made of Ti, TiN, Ta, TaN, or Cu. An insulating layer 28 is then formed above the rear surface of wafer W2 and the surface patterns of conductive layer 26. Insulator layer 28 may possibly be opened to make conductive layer 26 locally accessible. According to a preferred embodiment, a first insulator layer 22 may be formed above the rear surface of wafer W2, before the forming of openings 23, this insulator layer 22 being intended to protect the rear surface of wafer W2. Finally, above the rear surface of wafer W2, an insulator layer 29, formed of insulator layers 22 and 28, and comprising surface patterns of conductive layer 26, is obtained.

Figure 1H:
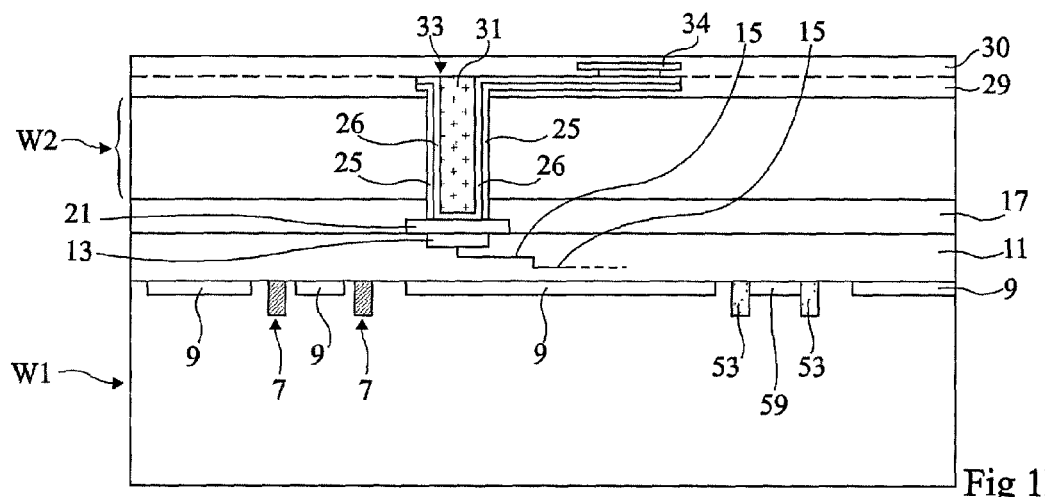

As illustrated in FIG. 1H, a next step comprises totally filling openings 23 with a material 31. Material 31 may be a conductive material such as a conductive paste, for example, based on copper, or an insulating material such as a polyimide. Conductive material layer 26 and material 31 form through vias 33. A redistribution layer 30 may further be formed above insulator layer 29, this redistribution layer comprising contacting areas 34 above the surface patterns of conductive layer 26. Contacting areas 34 are intended to receive conductive balls or copper pillars for a surface (flipchip) assembly.

Figure 1I:
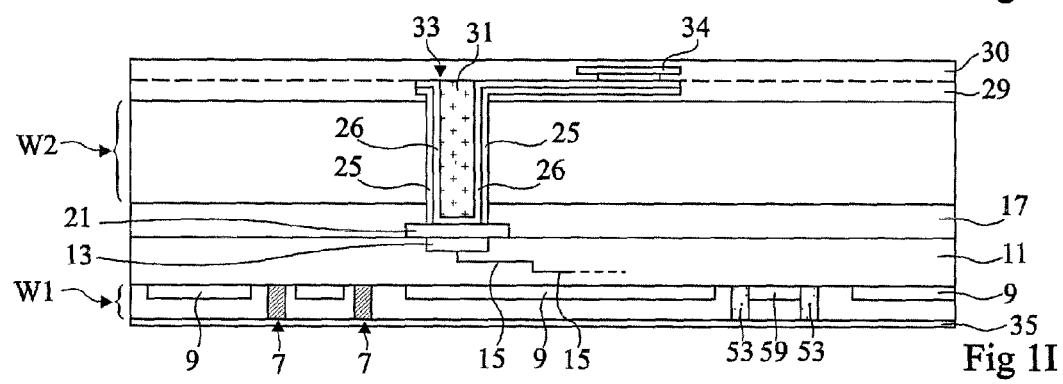

After having formed through vias 33, as illustrated in FIG. 1I, wafer W1 is thinned so that the thickness of wafer W1 after thinning is smaller than the depth of vias 7 and the ends of the vias are exposed. The thickness of wafer W1 after thinning for example ranges between 3 and 10 µm, for example, being on the order of 5 µm. A thin insulator layer 35 is then preferably deposited over the new rear surface of wafer W1.

At this stage of the method, without altering the mechanical integrity of wafers W1 and W2 or of the integrated circuit formed, connections to components manufactured on the front surface of wafer W1 have thus been transferred to the rear surface of wafer W2 by through vias 7 of very small width in wafer W1, and by through vias 33 having a larger width in wafer W2 comprising no components.

Figure 1J:
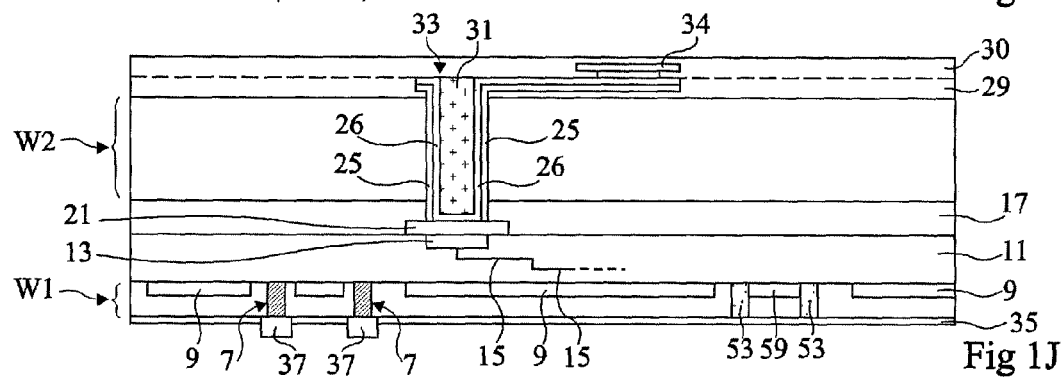

As illustrated in FIG. 1J, insulator layer 35 is opened in front of each via 7 and copper pillars 37 are formed from vias 7 of wafer W1. The width of pillars 37 for example is on the order of 20 µm. Pillars 37 are, for example, intended to receive contacts from another integrated circuit chip.

Figure 1K:
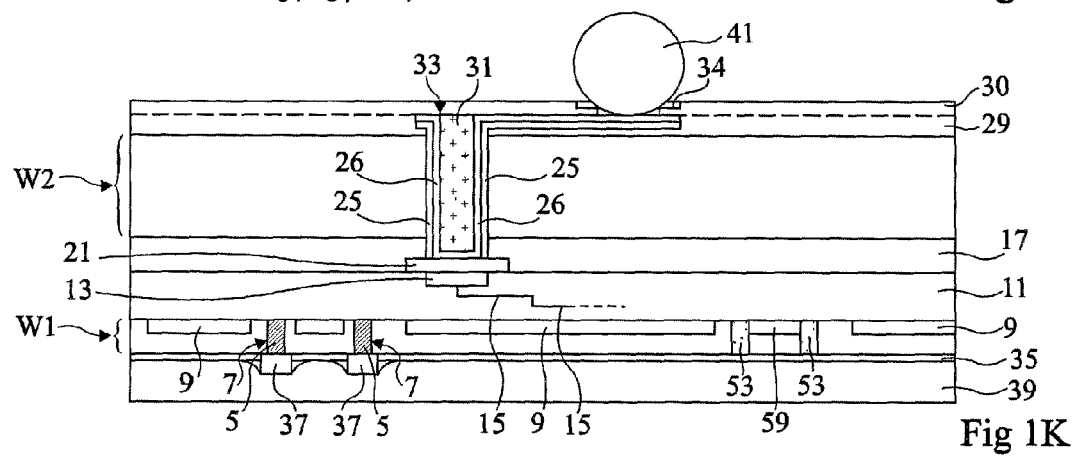

As illustrated in FIG. 1K, conductive balls 41 are attached to contacting areas 34 of redistribution layer 30 of the rear surface of wafer W2. During this operation, the rear surface of wafer W1 may be coated with a temporary protection layer 39. Another way to protect the rear surface of wafer W1 is to raise the wafer by means of a support to avoid for the rear surface to be in contact with the belt of a furnace used to remelt the balls. Balls 41 are, for example, intended to be welded to pads of another chip, of a package, or of a printed circuit board.

An assembly comprising a wafer W1 having a thickness smaller than 10 µm and a thicker wafer W2, for example, having a thickness ranging between 80 and 350 µm, is thus obtained. Wafer W1 comprises components in active areas 9 on its front surface side and vias 7, having a width smaller than 1 µm, crossing the semiconductor substrate. The front surface of wafer W1 supports interconnection levels 11, and copper pillars 37 are attached to through vias 7 on the rear surface side. The front surface of wafer W2, coated with an insulator layer 17, is placed against the front surface of wafer W1 supporting interconnection levels 11. Wafer W2 comprises through vias 33, for example having a width ranging between 8 and 50 µm. The rear surface of wafer W2 can support a redistribution layer 30 comprising contacting areas 34 attached to conductive balls 41.

Wafers W1 and W2 placed against each other in the state illustrated in FIG. 1K are then diced into chips, preferably while they are glued to a temporary protection layer 39.

Figure 2:
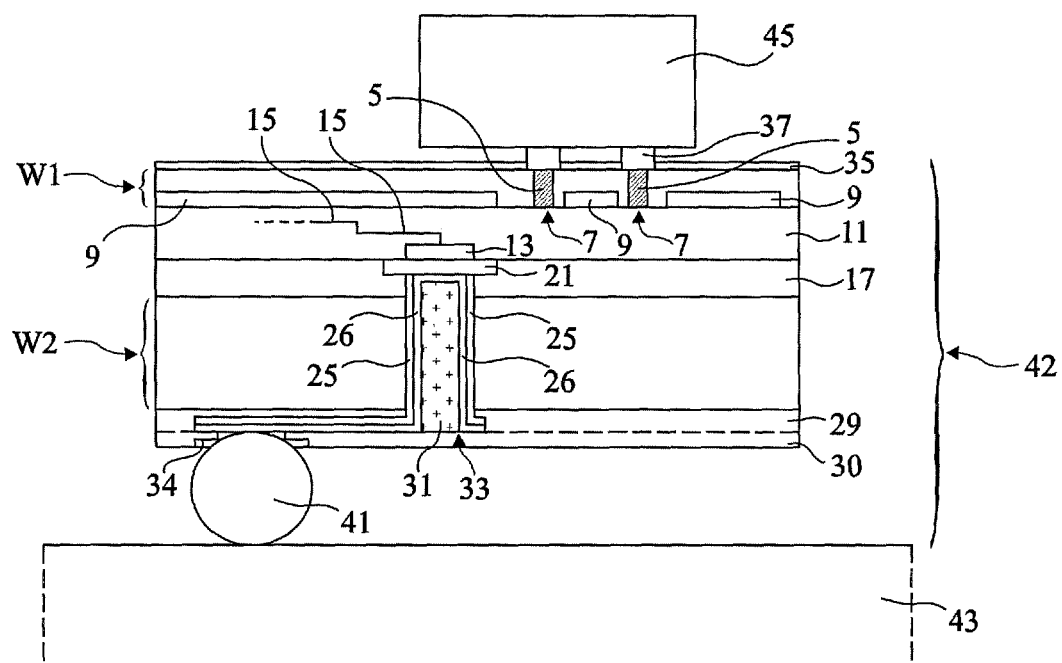
FIG. 2 is a cross-section view of an assembly of two stacked integrated circuits (in three dimensions (3D)), this assembly being obtained by a method such as that described in relation with FIGS. 1A to 1K.

FIG. 2 illustrates a portion of such an integrated circuit chip, 42. Balls 41 of chip 42 have been welded to pads of another chip, of a package, or of a printed circuit board 43. The contacts of another integrated circuit chip 45 have been attached to copper pillars 37. Chip 45 does not necessarily have the same size as chip 42. An assembly of two integrated circuits 42, 45 stacked on each other is thus obtained (in three dimensions (3D)).

An advantage of an integrated circuit obtained by a method such as described in relation with FIGS. 1A to 1K is the fact that wafer W1 comprising semiconductor components may be extremely thin, of a thickness smaller than 10 µm. Thus, connections to the components manufactured on the front surface of wafer W1 are transferred to its rear surface by vias of smaller width, for example, smaller than 1 µm. In technologies in which the elementary component dimensions are smaller than one micrometer, or even than one tenth of a micrometer, such widths are quite acceptable as compared with the component dimensions. Further, the mechanical impact of the vias on the components is thus limited, and parasitic electric couplings are decreased.

An additional advantage of an integrated circuit such as illustrated in FIG. 2 is that additional accesses to the front surface may be provided by through vias 33 formed in another wafer W2, placed against wafer W1. The vias in wafer W2 have a non-negligible diameter, which ensures a good thermal dissipation of the heat generated by the components operating in wafer W1. Further, interconnection levels 11 (designated as BEOL "Back-End-Of-Line" in the art), corresponding to metallizations 13, 15, generally made of copper and having a high density, are then located under the components and can be optimized to improve the heat dissipation of the integrated circuit.

An advantage of a method such as described in relation with FIGS. 1A to 1K is that it enables not to use any step of gluing to and separation from a temporary handle of the front surface of the integrated circuit supporting the components. Due to the absence of glue, high temperatures can be used in the steps of forming of through vias 33 in wafer W2 illustrated in FIGS. 1G and 1H. Through vias 33 of high form factor, totally filled or not, with decreased manufacturing constraints in both cases, can thus be formed.

An advantage of such a method is that it is particularly well adapted to the use of a direct bonding technique for the bonding of wafers W1 and W2. This is due to the fact that wafer W2 comprises no components and no integrated circuit. If the front surface of wafer W2 also had components in active areas, constraints in terms of surface area taken up by the respective active areas of the two wafers should be taken into account in the wafer bonding step.

An additional advantage of such a method is that, at the step of forming of openings 1 illustrated in FIG. 1A, other openings 51 intended to be used as insulation areas between active areas may also be formed. Openings 51 may for example be trenches, filled with an insulating material 53, for example, silicon oxide, at the step illustrated in FIG. 1B. As an example, an active area 59 formed between two trenches 51 filled with insulating material 53 have been shown in FIG. 1C. Since the thickness of wafer W1 supporting the components, after thinning, is smaller than the depth of trenches 51 filled with insulator 53, as illustrated in FIG. 1I, active areas 59 located between two trenches 51 are fully insulated. The performance of the components or groups of components, be they active or passive, of such active areas, is then improved.

Specific embodiments have been described. Various alterations, modifications, and improvements will occur to those skilled in the art. In particular, the doped areas of components may be formed before openings 1, at the beginning of the method described in relation with FIGS. 1A to 1K.

Such alterations, modifications, and improvements are intended to be part of this disclosure, and are intended to be within the spirit and the scope of the present invention.

Accordingly, the foregoing description is by way of example only and is not intended to be limiting. The present invention is limited only as defined in the following claims and the equivalents thereto.

What is claimed is:

1. A method for forming an integrated circuit having a surface capable of being placed on another integrated circuit, on a printed circuit, or on a package, and having its other surface capable of receiving an additional integrated circuit, the method comprising the steps of:
   a) forming openings in a front surface of a first semiconductor wafer, the depth of the openings being smaller than 10 µm, and filling them with a conductive material;
   b) forming doped areas of components in active areas of the front surface, forming interconnection levels) on said front surface and leveling said surface supporting the interconnection levels;
   c) covering with an insulating layer a front surface of a second semiconductor wafer, and leveling said surface coated with an insulator;
   d) applying the front surface of the second wafer coated with insulator on the front surface of the first wafer supporting interconnection levels, to obtain a bonding between the two wafers;
   e) forming vias from the rear surface of the second wafer, to reach the interconnection levels of the first wafer; and
   f) thinning the first wafer to reach the openings filled with conductive material.

2. The method of claim 1, wherein, at step d), the bonding between the first wafer and the second wafer is obtained by thermocompression bonding or by direct bonding.

3. The method of claim 1, further comprising, at step c), a step of forming of conductive contacts at the surface of the insulator layer covering the front surface of the second wafer.

4. The method of claim 3, wherein, at step d), each conductive contact comes into contact with a surface metallization of the interconnection levels of the first wafer and wherein, at step e), the vias are formed to reach the conductive contacts.

5. The method of claim 1, wherein the thickness of the first wafer after thinning is smaller than the depth of the openings and ranges between 3 and 10 µm.

6. The method of claim 1, wherein step a) of forming and filling of the openings of the first wafer comprises the steps of:
   coating the walls of said openings with insulator; and
   filling said insulated openings with a conductive material.

7. The method of claim 1, further comprising the step of forming second openings at the same time as said openings, and of filling the second openings with an insulating material to fully insulate active areas of the front surface of the first wafer.

8. The method of claim 1, wherein the second wafer has an initial thickness ranging between 650 and 750 µm and is thinned, after step d) of application of the front surfaces of each wafer against each other, down to a thickness ranging between 80 and 350 µm.

9. An integrated circuit having a surface capable of being placed on another integrated circuit, on a printed circuit, or on a package, and having its other surface capable of receiving an additional integrated circuit, said integrated circuit resulting from the dicing into chips of an assembly comprising:
   a first semiconductor wafer having a substrate thickness smaller than 10 µm, having its front surface comprising doped areas of components in active areas and supporting interconnection levels, said first wafer comprising through insulated openings filled with a conductive material;
   a second semiconductor wafer, having its front surface supporting an insulator layer, placed by thermocompression bonding or by direct bonding against the front surface of the first wafer supporting the interconnection levels, and having its rear surface supporting a redistribution layer comprising contacting areas, said second wafer comprising a plurality of through vias and not containing components; and
   copper pillars, capable of receiving contacts from an additional integrated circuit, attached to the openings filled with conductive material on the rear surface side of the first wafer.

10. The integrated circuit of claim 9, wherein the substrate thickness of the first wafer ranges between 3 and 10 µm and is smaller than the depth of the openings, and wherein the width of said openings is smaller than 1 µm.

11. The integrated circuit of claim 9, wherein the first wafer further comprises second through openings filled with an insulating material, capable of fully insulating active areas.

12. The integrated circuit of claim 9, wherein the substrate thickness of the second wafer ranges between 80 and 350 µm and wherein the width of the through vias ranges between 8 and 50 µm.

13. The integrated circuit of claim 11, wherein the material for filling said openings is selected from the group comprising polysilicon, tungsten, and copper, and the material for filling the second openings is silicon oxide.

* * * * *